United States Patent [19]
Forehand et al.

[11] Patent Number: 5,847,936
[45] Date of Patent: Dec. 8, 1998

[54] OPTIMIZED ROUTING SCHEME FOR AN INTEGRATED CIRCUIT/PRINTED CIRCUIT BOARD

[75] Inventors: Douglas W. Forehand, Mountain View; Ray Lamoreaux, Milpitas, both of Calif.

[73] Assignee: Sun Microsystems, Inc., Palo Alto, Calif.

[21] Appl. No.: 879,557

[22] Filed: Jun. 20, 1997

[51] Int. Cl.$^6$ ........................................ H05K 1/14
[52] U.S. Cl. .................. 361/794; 361/748; 361/751; 361/762; 361/760; 361/764; 361/765; 361/777; 361/807; 361/808; 361/820; 257/700; 257/738; 257/774; 257/778; 257/773; 257/787; 174/250; 174/255; 174/256; 174/260; 174/261; 174/265; 174/266
[58] Field of Search .................... 361/794, 748, 361/751, 762, 760, 764, 765, 777, 783, 807, 808, 820; 257/700, 701, 702, 778, 737, 738, 780, 773, 774, 787; 174/250, 255, 256, 257, 258, 259, 260, 261, 262, 265, 266

[56] References Cited

U.S. PATENT DOCUMENTS

| | | |
|---|---|---|
| 5,191,174 | 3/1993 | Chang et al. .......................... 174/266 |
| 5,400,220 | 3/1995 | Swamy ................................... 361/760 |
| 5,450,283 | 9/1995 | Lin et al. ................................ 361/704 |
| 5,535,101 | 7/1996 | Miles et al. ............................ 361/808 |
| 5,598,036 | 1/1997 | Jo ........................................... 257/738 |
| 5,615,477 | 4/1997 | Sweitzer .................................. 29/840 |

*Primary Examiner*—Leo P. Picard
*Assistant Examiner*—David Foster
*Attorney, Agent, or Firm*—Forrest Gunnison

[57] ABSTRACT

A method and structure for routing electrically conductive interconnect paths through a printed circuit board. The printed circuit board includes a plurality of insulating layers and conductive layers, including at least one electrically conductive voltage supply layer for receiving a first supply voltage. A plurality of voltage supply pad patterns are located at the upper surface of the printed circuit board. Each voltage supply pad pattern includes two or more electrically conductive pads which are coupled by one or more electrically conductive traces. Electrically conductive via plugs extend through the printed circuit board to connect the voltage supply layer to the voltage supply pad patterns. Each via plug is connected to one corresponding voltage supply pad pattern, thereby allowing each via plug to provide the first supply voltage to a plurality of pads at the upper surface of the printed circuit board. As a result, the number of via plugs required for routing the first supply voltage through the printed circuit board is reduced, thereby increasing the layout area available for routing conductive traces in other layers of the printed circuit board.

11 Claims, 5 Drawing Sheets

5,847,936

OPTIMIZED ROUTING SCHEME FOR AN INTEGRATED CIRCUIT/PRINTED CIRCUIT BOARD

BACKGROUND OF THE INVENTION

1. Field of the Invention

The present invention relates to a packaged integrated circuit which is connected to a printed circuit board. More particularly, the present invention relates a scheme for routing electrical connections between the printed circuit board and the integrated circuit.

2. Description of the Prior Art

FIG. 1 is a cross sectional schematic view of a packaged integrated circuit 101 mounted on a multi-layer printed circuit board (PCB) 102. Integrated circuit 101 includes an integrated circuit chip 103, bonding wires 104, an interconnect substrate 105 and an encapsulant 106. Bonding wires 104 extend from bonding pads (not shown) on the integrated circuit chip 103 to a first array of pads 107 on the upper surface of interconnect substrate 105. The encapsulant 106 covers integrated circuit chip 103 and bonding wires 104. Interconnect vias (not shown) extend from the first array of pads 107, through interconnect substrate 105, to a second array of pads 108 located on the lower surface of interconnect substrate 105. An array of solder balls 109 is coupled to the second array of pads 108 at the lower surface of substrate 105. In this manner, the array of solder balls 109 is electrically coupled to circuitry located on the integrated circuit chip 103.

The upper surface of multi-layer PCB 102 includes a third array of pads 110 which corresponds to the pattern of the array of solder balls 109. The array of solder balls 109 is connected to the third array of pads 110 as illustrated. Each pad in the third array of pads 110 is coupled to a corresponding via plug 111 which extends through the layers of PCB 102. Within the various layers of PCB 102, interconnect traces 112 are connected to the various via plugs 111, thereby connecting the traces 112 of PCB 102 to circuitry located on the integrated circuit chip 103.

FIG. 2 is a top view of the pattern of via plugs 111 which extend through PCB 102. As illustrated in FIG. 2, a relatively large number of via plugs are packed into a relatively small area on the PCB 102. As a result, the spacing between adjacent via plugs 111 is relatively small. Conductive traces 112 must be routed between the small spaces between adjacent via plugs 111. Such routing becomes difficult, if not impossible, as the number and packing density of the via plugs 111 increase.

It would therefore be desirable to have a method and structure for routing connections between a printed circuit board and an integrated circuit chip which minimizes the routing congestion of the conductive traces in the printed circuit board.

SUMMARY

Accordingly, the present invention provides a routing structure which includes a multi-layer printed circuit board having a plurality of interleaved insulating layers and conductive layers. At least one of the conductive layers is a voltage supply layer which is connected to receive a first supply voltage (e.g., $V_{DD}$ or $V_{SS}$). A plurality of voltage supply pad patterns are located on the upper surface of the printed circuit board. Each voltage supply pad pattern includes two or more electrically conductive voltage supply pads. The voltage supply pads of each voltage supply pad pattern are coupled by one or more electrically conductive traces on the upper surface of the printed circuit board. Each voltage supply pad pattern is connected to a single voltage supply via plug. The voltage supply via plugs, in turn, extend through the printed circuit board and are connected to the voltage supply layer.

As a result, each voltage supply via plug provides the first supply voltage to a plurality of voltage supply pads at the upper surface of the printed circuit board. Consequently, the number of voltage supply via plugs required for routing the first supply voltage through the printed circuit board is advantageously reduced. Reducing the number of voltage supply via plugs, reduces the packing density of the via plug pattern in the printed circuit board. This advantageously increases the layout area available for routing traces in other conductive layers of the printed circuit board. Locating the voltage supply via plugs adjacent to one another results in the formation of open layout areas within the printed circuit board which are located immediately adjacent to the grouped voltage supply via plugs.

This invention will be more fully understood in light of the following drawings taken together with the detailed description.

DETAILED DESCRIPTION

Figure 1:
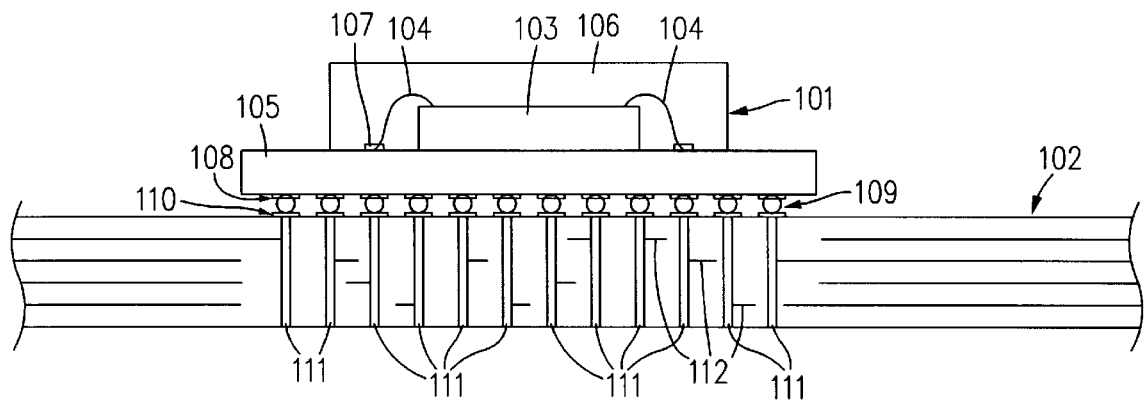
FIG. 1 is a cross sectional schematic view of a conventional integrated circuit and PCB.
Figure 2:
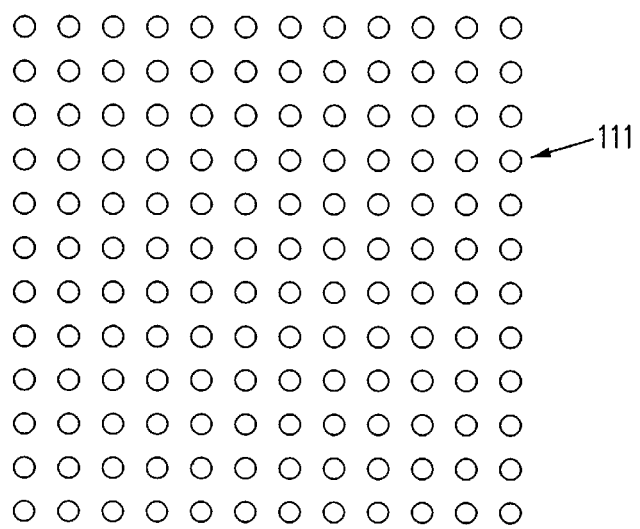
FIG. 2 is a top view of the pattern of via plugs which extend through the PCB of FIG. 1.
Figure 3:
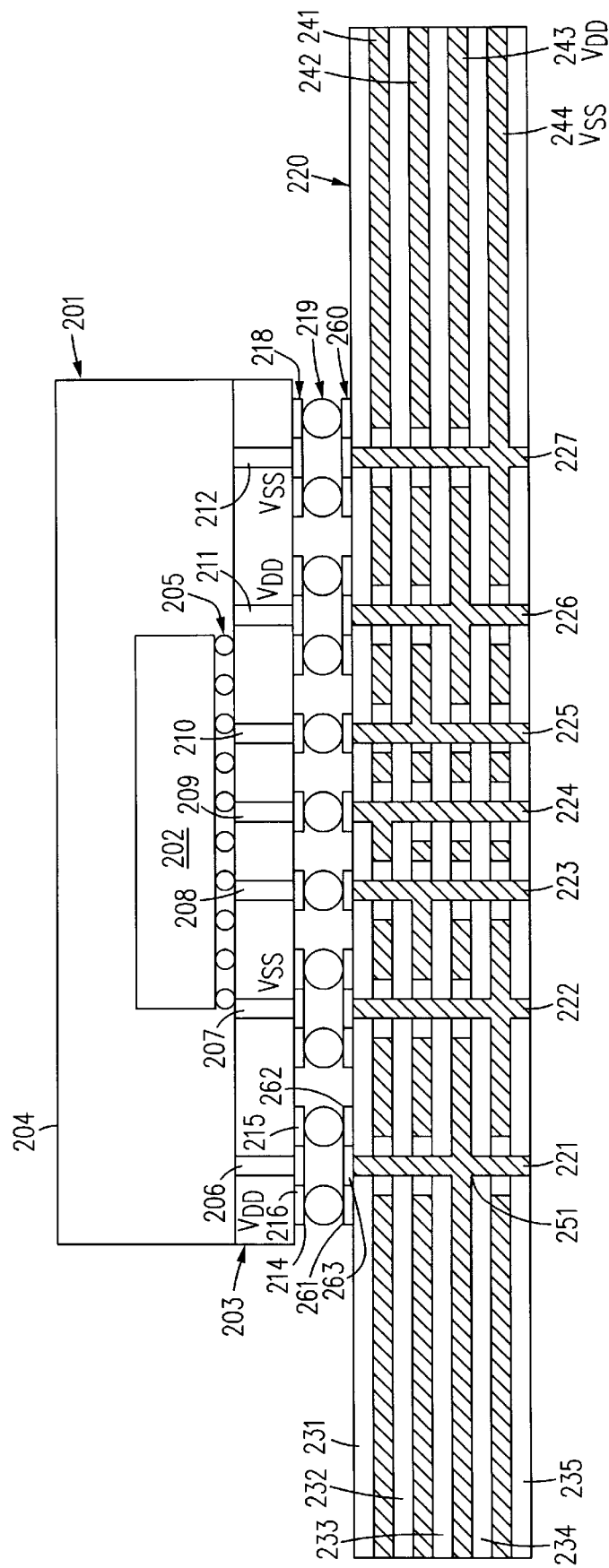
FIG. 3 is a cross sectional schematic view of a packaged integrated circuit and a PCB in accordance with one embodiment of the invention.

FIG. 3 is a cross sectional schematic view of a packaged integrated circuit 201 and a printed circuit board (PCB) 220 in accordance with one embodiment of the invention. Integrated circuit 201 includes a semiconductor chip 202 having circuitry fabricated thereon. Semiconductor chip 202 is surrounded by an encapsulant 204. A first solder ball array 205 is located on the lower surface of chip 202. Each of the solder balls in first solder ball array 205 is positioned on a corresponding bonding pad (not shown) on the lower surface of chip 202. In this manner, the first solder ball array 205 provides electrical connections to the circuitry fabricated on integrated circuit chip 202.

The first solder ball array 205 is further connected to an array of bonding pads (not shown) on the upper surface of interconnect substrate 203. Electrically conductive traces (not shown) extend from these bonding pads along the upper surface of the interconnect substrate 203. These traces contact electrically conductive via plugs, such as via plugs 206–213. Via plugs 206–213 extend through the body of interconnect substrate 203. The body of interconnect substrate 203 in the described embodiment is made of a ceramic, although other materials are possible and considered within the scope of the invention.

In the foregoing manner, the circuitry on integrated circuit chip 202 is electrically connected to via plugs 206–213.

Two or more voltage supply rails are typically fabricated on chip 202. These voltage supply rails are coupled to external voltage supplies to provide power to the chip 202. Each voltage supply rail is typically connected to the external voltage supply through multiple physical connections. That is, each voltage supply rail on chip 202 is connected to a plurality of solder balls of the first solder ball array 205.

In the described example, via plugs 206 and 211 are electrically connected to a first voltage supply rail ($V_{DD}$) of chip 202. Similarly, via plugs 207 and 212 are electrically connected to a second voltage supply rail ($V_{SS}$) of chip 202. Four solder balls in the first solder ball array 205 (and four corresponding traces on the upper surface of interconnect substrate 203) are dedicated for making the connections to the four via plugs 206, 207, 211 and 212. Via plugs which extend through interconnect substrate 203 and are electrically connected to a voltage supply rail on chip 202 are hereinafter referred to as voltage supply via plugs.

Chip 202 also includes input and/or output signal lines (hereinafter referred to as signal lines) for routing signals to and from the circuitry on chip 202. Each signal line on chip 202 is connected to a corresponding one of the solder balls in the first solder ball array 205. Via plugs 208, 209 and 210 are electrically connected to signal lines of chip 202. Three solder balls in the first solder ball array 205 (and three corresponding traces on the upper surface of interconnect substrate 203) are dedicated for making the connections to the three via plugs 208, 209 and 210. Via plugs which extend through interconnect substrate 203 and are electrically connected to signal lines of chip 202 are hereinafter referred to as signal line via plugs.

At the lower surface of interconnect substrate 203, an array of electrically conductive pads 218 are electrically connected to the via plugs 206–212. Each of the voltage supply via plugs 206, 207, 211 and 212 is connected to a corresponding pair of pads at the lower surface of interconnect substrate 203 through an interconnect trace. For example, voltage supply via plug 206 is connected to pads 214 and 215 by an interconnect trace 216. Each of the signal line via plugs 208–210 is connected to a corresponding pad at the lower surface of interconnect substrate 203. The array of pads 218 is coupled to a second solder ball array 219, each pad being coupled to a corresponding solder ball.

Printed circuit board 220 includes a plurality of electrically insulating layers 231–235 which are interleaved with a plurality of electrically conductive layers 241–244. In other embodiments, other numbers of conductive and insulating layers can be used in PCB 220. An array of electrically conductive pads 260 is located at the upper surface of PCB 220. Each pad in array 260 is connected to a corresponding solder ball in the second solder ball array 219. Interconnect traces located at the upper surface of PCB 220 electrically connect selected adjacent pads of array 260. For example, interconnect trace 263 connects adjacent pads 261 and 262 of pad array 260. The interconnect traces are located to enable at least two adjacent pads of pad array 260 to be connected to at least two solder balls in solder ball array 219 which are, in turn, electrically connected to a voltage supply rail on chip 202. Each pair of connected adjacent pads of pad array 260 which is coupled to a voltage supply rail on chip 202 is hereinafter referred to as a voltage supply pad pattern. Thus, adjacent pads 261–262 and interconnect trace 263 form a voltage supply pad pattern.

In the example illustrated in FIG. 3, each voltage supply pad pattern of pad array 260 is electrically connected to a corresponding one of the voltage supply via plugs 206, 207, 211 and 212 in interconnect substrate 203. For example, the voltage supply pad pattern formed by pads 261–262 and interconnect trace 263 is connected to voltage supply via plug 206. Each of the signal line via plugs 208–211 is electrically connected to a single pad in pad array 260 (hereinafter referred to as signal pads of array 260).

PCB 220 further includes a plurality of electrically conductive via plugs 221–228 which extend through the various layers of PCB 220.

Each of the voltage supply pad patterns of pad array 260 is electrically connected to a single via plug in PCB 220. Thus, via plugs 221, 222, 226 and 227 in PCB 220 are each connected to a corresponding voltage supply pad pattern of pad array 260. The via plugs in PCB 220 which are connected to voltage supply pad patterns are hereinafter referred to as PCB voltage supply via plugs.

Each signal pad of pad array 260 is electrically connected to a single via plug in PCB 220. Thus, via plugs 223–225 are each connected to a corresponding signal pad of pad array 260. The via plugs in PCB 220 which are connected to the signal pads of pad array 260 are hereinafter referred to as PCB signal via plugs.

In the example illustrated in FIG. 3, interconnect layers 241 and 242 are patterned to provide a plurality of electrically conductive traces which are connected to the PCB signal via plugs 223–225. For example, a trace in interconnect layer 241 is connected to PCB signal via plug 224 as illustrated. Similarly, traces in interconnect layer 242 are connected to PCB signal via plugs 223 and 225 as illustrated. The traces of interconnect layers 241 and 242 are connected to circuitry located outside the view of FIG. 3.

In FIG. 3, conductive interconnect layer 243 serves as a $V_{DD}$ voltage supply plane within PCB 220. That is, interconnect layer 243 is coupled to a first external $V_{DD}$ voltage supply outside of the view of FIG. 3. Interconnect layer 243 is a substantially continuous conductive layer having a plurality of openings which allow selected PCB via plugs to extend through interconnect layer 243 without contacting interconnect layer 243. For example, PCB signal via plugs 223–225 and PCB voltage supply via plugs 222 and 227 pass through openings in interconnect layer 243, such that these via plugs are not connected to the $V_{DD}$ voltage supply plane 243. PCB voltage supply via plugs 221 and 226 are connected to interconnect layer 243 as illustrated, thereby providing the $V_{DD}$ supply voltage to these via plugs 221, 226.

Similarly, conductive interconnect layer 244 serves as a $V_{SS}$ voltage supply plane within PCB 220. That is, interconnect layer 244 is coupled to a second external $V_{ss}$ voltage supply outside of the view of FIG. 3. Interconnect layer 244 is a substantially continuous conductive layer having a plurality of openings which allow selected PCB via plugs to extend through interconnect layer 244 without contacting interconnect layer 244. For example, PCB signal via plugs 223–226 and PCB voltage supply via plugs 221 and 226 pass through openings in interconnect layer 244, such that these PCB via plugs are not connected to the $V_{SS}$ voltage supply plane 244. PCB voltage supply via plugs 222 and 227 are connected to interconnect layer 244 as illustrated, thereby providing the $V_{SS}$ supply voltage to these via plugs 222, 227.

Because each one of the PCB voltage supply via plugs 221, 222, 226 and 227 is connected to a voltage supply pad pattern which provides two connections to a voltage supply rail, the number of PCB voltage supply via plugs required in PCB 220 is greatly reduced when compared with prior art printed circuit boards. More specifically, if each PCB voltage supply via plug is connected to a voltage supply pad pattern which provides two connections to a voltage supply rail, then the required number of PCB voltage supply via plugs is half of that required in prior art printed circuit boards. Similarly, if each PCB voltage supply via plug is connected to a voltage supply pad pattern which provides three connections to a voltage supply rail, then the required number of PCB voltage supply via plugs is reduced to one third of that required in prior art printed circuit boards.

By reducing the number of PCB voltage supply via plugs extending through PCB 220, the area existing between via plugs 221–227 is increased. As a result, a greater layout area is provided for routing electrically conductive traces of the various interconnect layers to the PCB signal via plugs.

Figure 4:
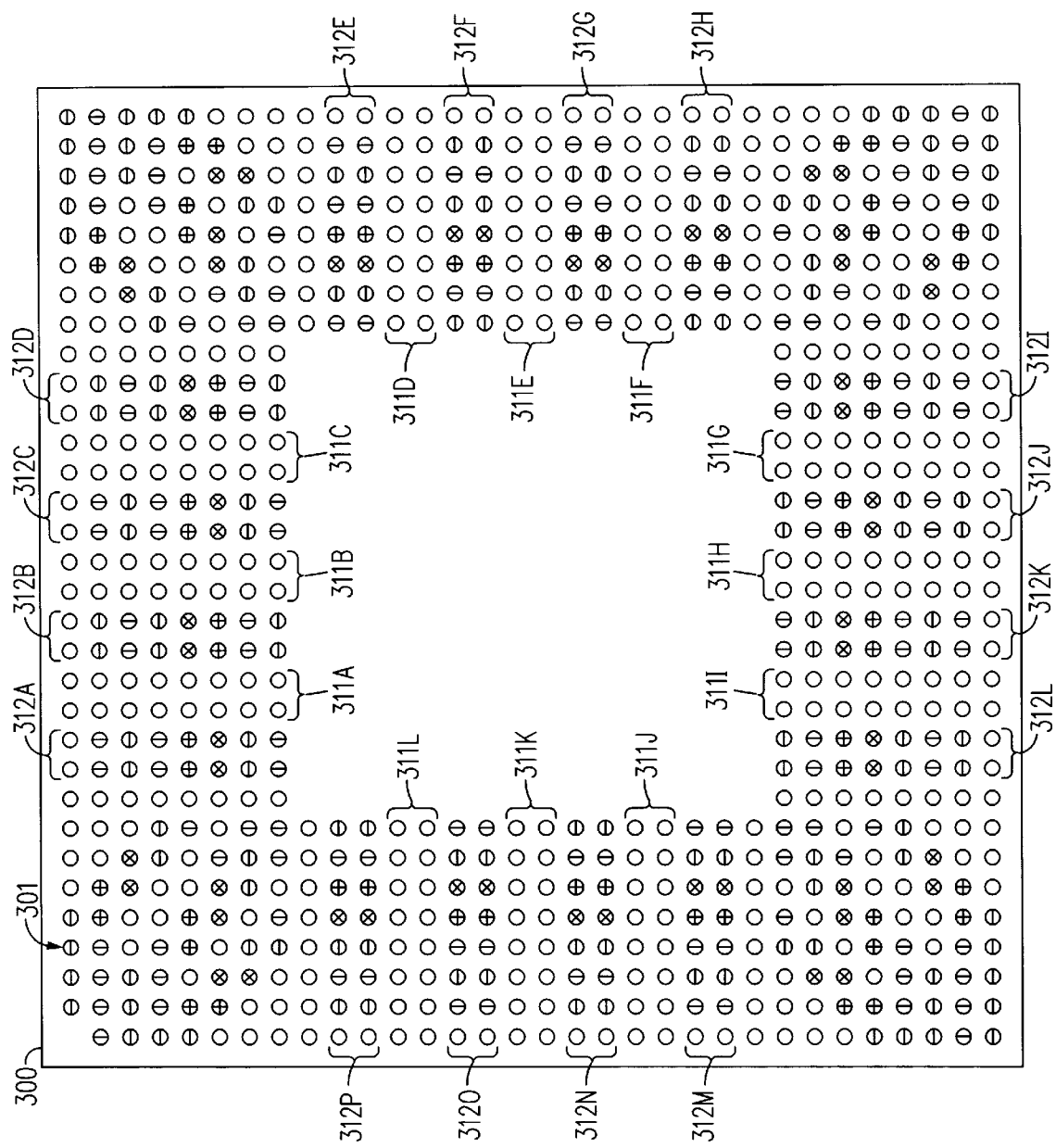
FIG. 4 is a top view of an array of solder balls located at the lower surface of interconnect substrate in accordance with one embodiment of the invention.
Figure 5:
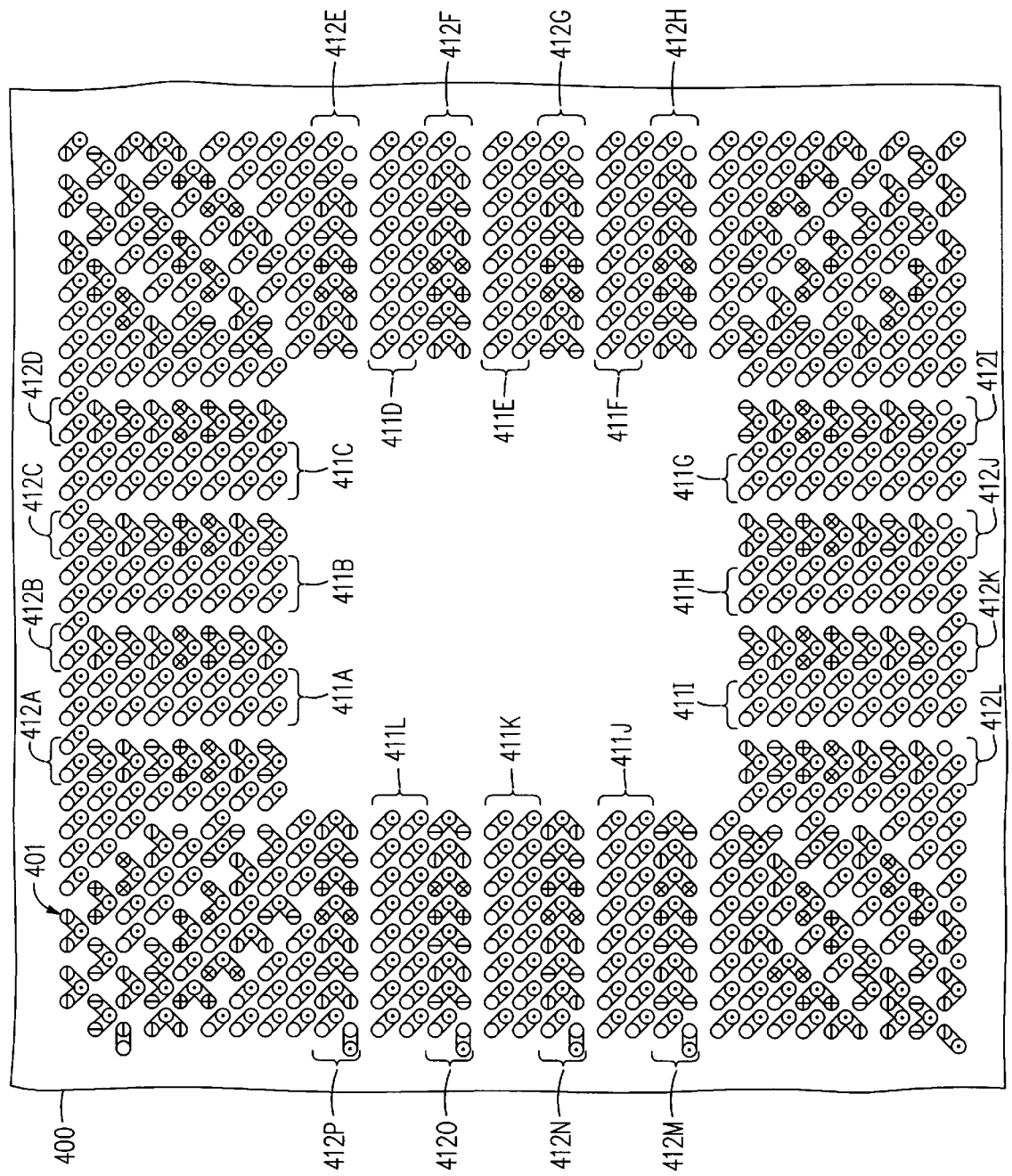
FIG. 5 is a top view of a printed circuit board which is used with the array of solder balls of FIG. 4 in accordance with one embodiment of the invention.
Figure 6:
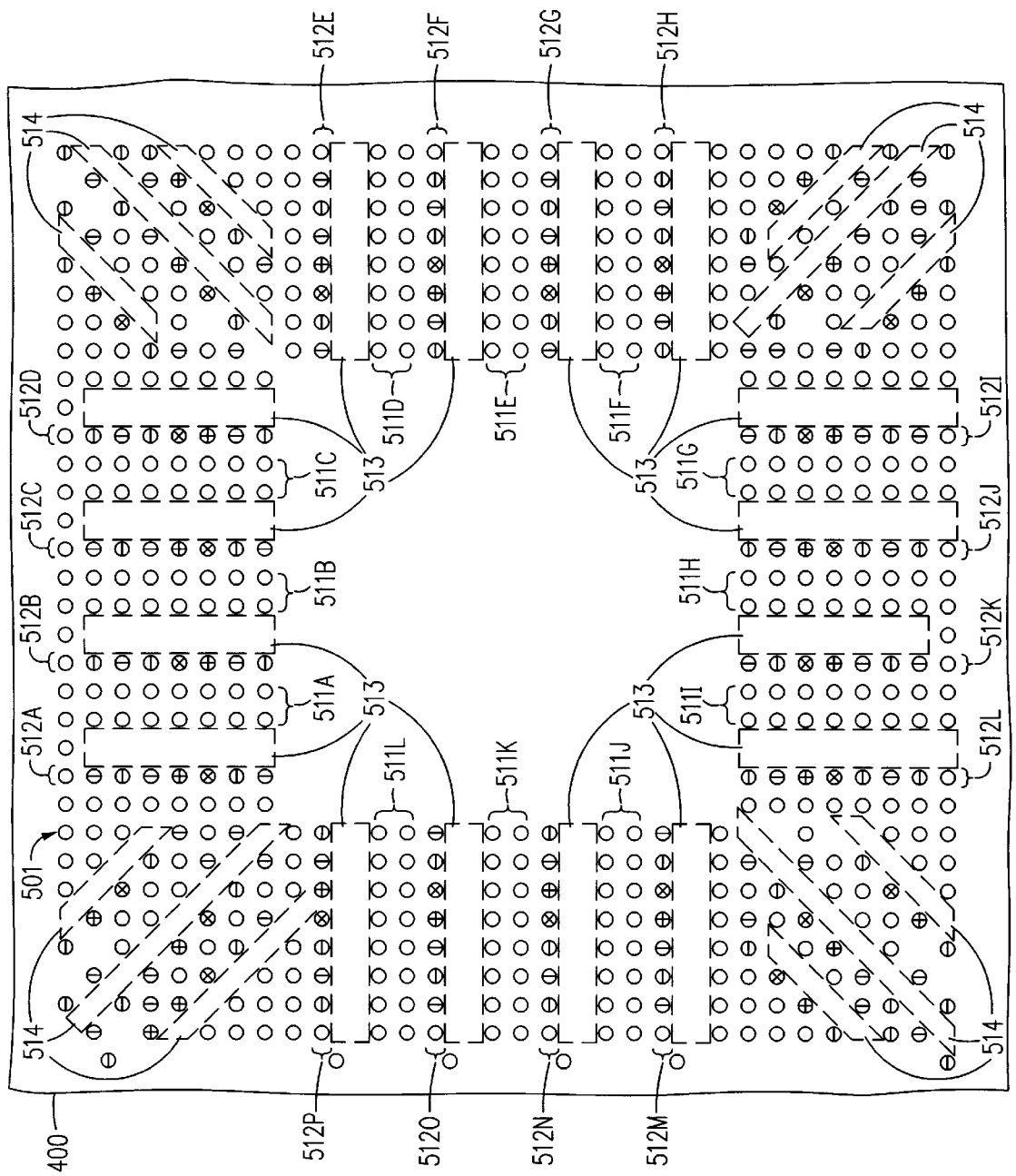
FIG. 6 is a top view of the via plug pattern which extends through the printed circuit board of FIG. 5.

The increased routing area which is provided by reducing the reduced number of PCB voltage supply via plugs in PCB 220 is more fully appreciated by top views of an integrated circuit/printed circuit board structure in accordance with the invention. FIGS. 4–6 provide top views of various structures of an integrated circuit/printed circuit board structure in accordance with one embodiment of the invention.

FIG. 4 is a top view of an array of solder balls 301 which are located at the lower surface of interconnect substrate 300 in accordance with one embodiment of the invention. The solder ball array 301 is electrically connected to a corresponding chip in the same manner that solder ball array 219 is connected to chip 202 in FIG. 3. The solder ball array 301 is arranged as a 32×32 array with the centrally located 16×16 array left empty. The solder balls of array 301 are connected to: (1) a core $V_{DD}$ voltage supply rail ($V_{DDc}$) of the corresponding chip, (2) a "dirty" $V_{DD}$ voltage supply rail ($V_{DDo}$) of the corresponding chip, (3) a core $V_{SS}$ voltage supply rail ($V_{SSc}$) of the corresponding chip, (4) a "dirty" $V_{SS}$ voltage supply rail ($V_{SSo}$) of the corresponding chip, and (5) signal lines of the corresponding chip.

The solder balls in array 301 which are connected to the $V_{DDc}$ voltage supply rail of the corresponding chip are illustrated as circles containing a plus (+) symbol.

The solder balls in array 301 which are connected to the $V_{DDo}$ voltage supply rail of the corresponding chip are illustrated as circles containing a vertical line (|).

The solder balls in array 301 which are connected to the $V_{SSc}$ voltage supply rail of the corresponding chip are illustrated as circles containing an X symbol.

The solder balls of array 301 which are connected to the $V_{SSo}$ voltage supply rail of the corresponding chip are illustrated as circles containing a horizontal dash (—) symbol.

The solder balls in array 301 which are connected to signal lines of the corresponding chip are illustrated as empty circles.

The solder balls of array 301 which are connected to the various voltage supply rails of the corresponding chip are distributed throughout the solder ball array 301 as illustrated. In general, the solder ball array 301 includes signal line solder ball arrays 311A–311L and voltage supply solder ball arrays 312A–312P. Each of the signal line solder ball arrays 311A–311L includes a plurality of adjacent solder balls which are connected to signal lines of the corresponding chip. Similarly, each of the voltage supply solder ball arrays 312A–312P includes a plurality of adjacent solder balls which are predominantly connected to the various voltage supply rails of the corresponding chip.

Within solder ball array 301, 2×8 signal line solder ball arrays 311A–311L are interleaved with 2×7 power supply solder ball arrays 312A–312P. The significance of this interleaved arrangement will become evident in view of the subsequent disclosure. Near the corners of solder ball array 301, the various types of solder balls are interspersed, with redundant voltage supply solder balls being located nearest the corners of the solder ball array 301.

FIG. 5 is a top view of a printed circuit board 400 which can be used with the solder ball array 301 of FIG. 4 in accordance with one embodiment of the invention. The upper surface of PCB 400 includes a pattern 401 of pads, interconnect traces and via plugs. The via plugs of pattern 401 are illustrated as circles containing a dot symbol (•). These via plugs extend from the upper surface of PCB 400 down through the various layers of the PCB in the manner previously described for PCB via plugs 221–227 (FIG. 3). The pads of pattern 401 are illustrated as empty circles (signal pads), or as circles containing a plus (+) symbol, a vertical line (|), an X symbol, or a horizontal dash (—) symbol (voltage supply pads). The interconnect traces extend between the pads and the via plugs as illustrated.

Interconnect substrate 300 (FIG. 4) is connected to PCB 400 (FIG. 5) such that the solder balls of solder ball array 301 are aligned with the pads of pattern 401. Each of the pads of pattern 401 is coded to reflect the type of solder ball to which the pad is connected. For example, the pads of pattern 401 which are connected to solder balls in array 301 which are in turn connected to the $V_{DDc}$ voltage supply rail of the corresponding chip are illustrated with circles containing a plus (+) symbol. The other pads of pattern 401 are coded in a similar manner, with similar symbols in FIGS. 4 and 5 referring to similar connections. Thus, the pads in pattern 401 exhibit a configuration which corresponds to the configuration of the solder balls in solder ball array 301.

As a result, the pads in pattern 401 are arranged as a plurality of signal pad arrays 411A–411L and a plurality of voltage supply pad arrays 412A–412P. Signal pad arrays 411A–411L are interleaved with voltage supply pad arrays 412A–412P. Each of signal pad arrays 411A–411L includes a plurality of signal pads, along with their corresponding interconnect traces and PCB signal via plugs. The signal pad arrays 411A–411L are dedicated to carrying input and/or output signals between the corresponding chip and the PCB 400. Each signal pad is connected to a single corresponding PCB signal via plug by an interconnect trace.

Similarly, each of the voltage supply pad arrays 412A–412P includes a plurality of voltage supply pads, along with their corresponding interconnect traces and PCB voltage supply via plugs. The voltage supply pad arrays 412A–412P are dedicated to providing supply voltages from the PCB 400 to the corresponding chip. Each of the PCB voltage supply via plugs in the voltage supply pad arrays 412A–412P is connected to a pair of voltage supply pads through corresponding interconnect traces. Stated another way, each of the PCB voltage supply via plugs is connected to a corresponding voltage supply pad pattern which is defined by two voltage supply pads and the interconnect traces which connect these two voltage supply pads.

FIG. 6 is a top view of the PCB via plug pattern 501 which extends through the various layers of PCB 400. In FIG. 6, the PCB via plugs of pattern 501 have been labeled as empty circles (for PCB signal via plugs), or as circles containing a plus (+) symbol, a vertical line (|), an X symbol or a horizontal dash (—) symbol (for PCB voltage supply via plugs). (That is, in FIG. 6, the PCB via plugs are no longer illustrated as circles containing dot symbols (•), as previously done in FIG. 5). For example, the PCB voltage supply via plugs which are connected to receive the $V_{DDo}$ supply voltage are illustrated as circles containing a vertical line (|). The other PCB via plugs of pattern 501 are coded in a similar manner, with similar symbols in FIGS. 4, 5 and 6 referring to similar connections.

PCB via plug pattern 501 includes PCB signal via plug arrays 511A–511L which are coupled to receive input and/or output signals, and PCB voltage supply via plug arrays 512A–512P, which are coupled to receive supply voltages. The two-to-one grouping of voltage supply pads-to-PCB voltage supply via plugs provided by voltage supply pad arrays 412A–412P (FIG. 5) results in open areas 513 in the via plug pattern 501 (FIG. 6). Open areas 513 exist adjacent each to each of the PCB voltage supply via plug arrays 512A–512P.

Similarly, open areas 514 exist adjacent to diagonal groups of PCB voltage supply via plugs which are located near the corners of pattern 501. Open areas 513 and 514 advantageously allow greater layout area for routing traces within the various layers of PCB 400.

Although the invention has been described in connection with several embodiments, it is understood that this invention is not limited to the embodiments disclosed, but is capable of various modifications which would be apparent to one of ordinary skill in the art. For example, although the invention has been described in connection with a flip chip arrangement which uses first array of solder balls 205 to connect chip 202 to interconnect substrate 203, it is understood that other methods, such as wire bonding, can be used to perform this function in other embodiments of the invention. In addition, although a two-to-one voltage supply pad-to-PCB voltage supply via plug configuration has been described, in other embodiments, ratios greater than two-to-one can be used. For example, three voltage supply pads could be connected to a single PCB voltage supply via plug to open up additional routing area within the printed circuit board. Thus, the invention is limited only by the following claims.

What is claimed is:

1. A printed circuit board comprising:
   a plurality of insulating layers;
   a first electrically conductive layer located between the insulating layers, the first conductive layer being adapted to receive a first supply voltage;
   a first voltage supply pad pattern located over the insulating layers, the first voltage supply pad pattern comprising a plurality of electrically conductive pads which are coupled by one or more electrically conductive traces; and
   a first electrically conductive via plug which extends through the insulating layers and contacts the first conductive layer, wherein the first via plug is further connected to the first voltage supply pad pattern.

2. The printed circuit board of claim 1, further comprising:
   a second voltage supply pad pattern located over the insulating layers, the second voltage supply pad pattern comprising a plurality of electrically conductive pads which are coupled by one or more electrically conductive traces; and
   a second electrically conductive via plug which extends through the insulating layers and contacts the first conductive layer, wherein the second via plug is further connected to the second voltage supply pad pattern.

3. The printed circuit board of claim 2, wherein the first via plug is located adjacent to the second via plug in the printed circuit board.

4. The printed circuit board of claim 1, further comprising:
   a second electrically conductive layer located between the insulating layers, the second conductive layer being adapted to receive a second supply voltage;
   a second voltage supply pad pattern located over the insulating layers, the second voltage supply pad pattern comprising a plurality of electrically conductive pads which are coupled by one or more electrically conductive traces; and
   a second electrically conductive via plug which extends through the insulating layers and contacts the second conductive layer, wherein the second via plug is further connected to the second voltage supply pad pattern.

5. The printed circuit board of claim 4, wherein the first via plug is located adjacent to the second via plug in the printed circuit board.

6. The printed circuit board of claim 1, further comprising:
   an electrically conductive patterned layer located between the plurality of insulating layers and electrically insulated from the first voltage supply layer, wherein the patterned layer comprises a plurality of electrically conductive traces;
   a plurality of electrically conductive signal pads located over the insulating layers; and
   a plurality of electrically conductive signal via plugs which extend through the insulating layers, each of the plurality of signal via plugs being connected to a corresponding one of the signal pads, and each of the plurality of signal via plugs being connected to a corresponding one of the traces.

7. An apparatus comprising:
   an integrated circuit chip having a first voltage supply rail for receiving a first supply voltage;
   an interconnect substrate coupled to the integrated circuit chip, the interconnect substrate having a first plurality of electrically conductive pads exposed at a surface of the interconnect substrate;
   means for coupling the first plurality of pads to the first voltage supply rail;
   a printed circuit board having a plurality of insulating layers, a first electrically conductive layer for receiving the first supply voltage located between the insulating layers, a first voltage supply pad pattern located over the insulating layers, and a first electrically conductive via plug which extends through the insulating layers and contacts the first conductive layer and the first voltage supply pad pattern, wherein the first voltage supply pad pattern comprises a second plurality of electrically conductive pads which are coupled by one or more electrically conductive traces; and
   means for connecting the first plurality of pads to the second plurality of pads.

8. The apparatus of claim 7, wherein the means for connecting the first plurality of pads to the second plurality of pads comprises a plurality of solder balls.

9. The apparatus of claim 7, wherein the means for connecting the first plurality of pads to the first voltage supply rail comprises a plurality of solder balls.

10. The apparatus of claim 7, wherein the means for connecting the first plurality of pads to the first voltage supply rail comprises a plurality of bonding wires.

11. A method of routing a supply voltage through a multi-layer printed circuit board, the method comprising the steps of:

applying the supply voltage to an electrically conductive interconnect layer in the printed circuit board;

routing the supply voltage from the interconnect layer to an electrically conductive via plug which extends through one or more layers of the printed circuit board; and routing the supply voltage from the via plug to a pad pattern at an external surface of the printed circuit board, the pad pattern comprising a plurality of electrically conductive pads, whereby the via plug provides the plurality of pads with the supply voltage.

* * * * *